US008519478B2

(12) United States Patent
Rassel et al.

(10) Patent No.: US 8,519,478 B2
(45) Date of Patent: Aug. 27, 2013

(54) SCHOTTKY BARRIER DIODE, A METHOD OF FORMING THE DIODE AND A DESIGN STRUCTURE FOR THE DIODE

(75) Inventors: Robert M. Rassel, Colchester, VT (US); Mark E. Stidham, Bloomington, IN (US)

(73) Assignee: International Business Machines Corporation, Armonk, NY (US)

( * ) Notice: Subject to any disclaimer, the term of this patent is extended or adjusted under 35 U.S.C. 154(b) by 235 days.

(21) Appl. No.: 13/019,716

(22) Filed: Feb. 2, 2011

(65) Prior Publication Data
US 2012/0193747 A1 Aug. 2, 2012

(51) Int. Cl.
*H01L 29/06* (2006.01)

(52) U.S. Cl.
USPC ........................ 257/335; 257/E21.345; 438/87

(58) Field of Classification Search
USPC .................... 257/335, 341, E21.345, E21.41, 257/E29.013; 438/87
See application file for complete search history.

(56) References Cited

U.S. PATENT DOCUMENTS

| | | | |
|---|---|---|---|
| 4,414,737 A | 11/1983 | Menjo et al. | |
| 4,607,270 A | 8/1986 | Iesaka | |
| 5,109,256 A | 4/1992 | De Long | |
| 6,096,618 A | 8/2000 | Dunn et al. | |
| 6,121,122 A | 9/2000 | Dunn et al. | |
| 6,399,413 B1 | 6/2002 | Krutsick | |
| 6,576,974 B1 | 6/2003 | Chang et al. | |
| 6,949,454 B2 | 9/2005 | Swanson et al. | |
| 7,098,521 B2 | 8/2006 | Coolbaugh et al. | |
| 7,384,854 B2 | 6/2008 | Voldman | |
| 2006/0071292 A1 | 4/2006 | Coolbaugh et al. | |
| 2006/0180892 A1 | 8/2006 | Pardoen | |
| 2006/0244050 A1 | 11/2006 | Sudou | |
| 2007/0210401 A1* | 9/2007 | Sanfilippo et al. | 257/471 |
| 2008/0087978 A1 | 4/2008 | Coolbaugh et al. | |
| 2008/0189671 A1* | 8/2008 | Habib et al. | 716/18 |
| 2008/0276034 A1* | 11/2008 | Harding et al. | 710/316 |
| 2009/0283841 A1 | 11/2009 | Yeh et al. | |
| 2010/0005219 A1* | 1/2010 | Loughner et al. | 711/5 |
| 2010/0230779 A1* | 9/2010 | Anderson et al. | 257/516 |
| 2010/0279483 A1 | 11/2010 | Collins et al. | |
| 2011/0284930 A1* | 11/2011 | Hershberger et al. | 257/270 |

OTHER PUBLICATIONS

PCT/US2012/021483, IFD: Jan. 17, 2012, International Search Report, Aug. 30, 2012, 10 pages.
Sankaran et al., "Schottky diode with cutoff frequency of 400 GHz fabriacted in 0.18 μm CMOS," Electronics Letters, vol. 41, No. 8, 2005, pp. 506-508.

* cited by examiner

*Primary Examiner* — Thomas L Dickey
(74) *Attorney, Agent, or Firm* — Gibb & Riley, LLC; Anthony J. Canale

(57) ABSTRACT

Disclosed are embodiments of a Schottky barrier diode. This diode can be formed in a semiconductor substrate having a doped region with a first conductivity type. A trench isolation structure can laterally surround a section of the doped region at the top surface of the substrate. A semiconductor layer can be positioned on the top surface of the substrate. This semiconductor layer can have a Schottky barrier portion over the defined section of the doped region and a guardring portion over the trench isolation structure laterally surrounding the Schottky barrier portion. The Schottky barrier portion can have the first conductivity type and the guarding portion can have a second conductivity type different from the first conductivity type. A metal silicide layer can overlie the semiconductor layer. Also disclosed are embodiments of a method of forming this Schottky barrier diode and of a design structure for the Schottky barrier diode.

20 Claims, 11 Drawing Sheets

SCHOTTKY BARRIER DIODE, A METHOD OF FORMING THE DIODE AND A DESIGN STRUCTURE FOR THE DIODE

BACKGROUND

1. Field of the Invention

The present invention relates to Schottky barrier diodes and, more particularly, to a Schottky barrier diode with reduced parasitic capacitance, a method of forming the diode and a design structure for the diode.

2. Description of the Related Art

A Schottky barrier diode is a rectifying element created by a potential barrier, which is formed at the junction between a semiconductor surface and a metal layer on that surface. Schottky barrier diodes typically exhibit relatively low forward voltage drops and relatively fast switching speeds as compared to conventional P-N junction diodes. However, they also typically exhibit a relatively high electric field around the outer edge of the semiconductor-metal junction. This electric field can negatively impact device performance (e.g., can lower breakdown voltage and/or can increase reverse bias leakage current). To reduce or eliminate this electric field, Schottky barrier diodes often incorporate a guardring to border the outer edge of the semiconductor-metal junction, where the semiconductor has a first conductivity type and the guardring has a second conductivity type that is different from the first conductivity type. For example, a P-type guardring can surround an N-type semiconductor-metal junction or an N-type guardring can surround a P-type semiconductor-metal junction. Unfortunately, such a guardring also introduces parasitic capacitance into the device (e.g., between the second conductivity type guardring and the first conductivity type semiconductor below the semiconductor-metal junction).

SUMMARY

In view of the foregoing disclosed herein are embodiments of an improved Schottky barrier diode. This diode can comprise semiconductor substrate having a doped region with a first conductivity type (e.g., an N-type well region or cathode region). A trench isolation structure can laterally surround a defined section of the doped region at the top surface of the substrate. A semiconductor layer can be positioned on the top surface of the substrate. This semiconductor layer can have a Schottky barrier portion over the defined section of the doped region and also a guardring portion over the trench isolation structure and laterally surrounding the Schottky barrier portion. The Schottky barrier portion can have the first conductivity type (e.g., N-type Schottky barrier portion) and the guarding portion can have a second conductivity type that is different from the first conductivity type of the Schottky barrier portion (e.g., P-type guardring portion). A metal silicide layer can overlie the semiconductor layer, thereby creating the required semiconductor-metal junction for the diode. Thus, this Schottky barrier diode incorporates a guardring to reduce the high electric field around the outer edge of the semiconductor-metal silicide junction. Additionally, since this guardring is separated by a trench isolation structure from the doped region in the substrate below, parasitic capacitance is minimized. Also disclosed are embodiments of a method of forming this Schottky barrier diode and of a design structure for the Schottky barrier diode.

More particularly, disclosed herein are embodiments of a Schottky barrier diode. This diode can comprise a semiconductor substrate having a doped region with a first conductivity type (e.g., a first conductivity type well region). A trench isolation structure can be positioned laterally around a section of this doped region at the top surface of the substrate. Additionally, a semiconductor layer can be positioned on the top surface of the substrate. This semiconductor layer can comprise a first portion having the first conductivity type and being positioned above the section of the doped region defined by the trench isolation structure. This semiconductor layer can further comprise a second portion having a second conductivity type different from the first conductivity type and being positioned above the trench isolation structure such that it laterally surrounds the first portion. A metal silicide layer can overlie the semiconductor layer, thereby creating the required semiconductor-metal junction for the diode.

In one exemplary embodiment, this Schottky barrier diode can comprise a semiconductor substrate having an N-doped region (e.g., an N-well). A trench isolation structure can be positioned laterally around a section of this N-doped region at the top surface of the substrate. Additionally, a semiconductor layer can be positioned on the top surface of the substrate. This semiconductor layer can comprise an N-type portion positioned above the section of the N-doped region defined by the trench isolation structure. This semiconductor layer can further comprise a P-type portion positioned above the trench isolation structure such that it laterally surrounds the N-type portion. A metal silicide layer can overlie the semiconductor layer, thereby creating the required semiconductor-metal junction for the diode.

Also disclosed herein are embodiments of a method of forming a Schottky barrier diode. The method embodiments can comprise providing a semiconductor substrate having a doped region with a first conductivity type (e.g., a first conductivity type well region). A trench isolation structure can be formed such that it laterally surrounds a section of the doped region at a top surface of the substrate. Next, a semiconductor layer can be formed on the top surface of the substrate such that it comprises a first portion and a second portion. Specifically, the semiconductor layer can be formed such that the first portion has the first conductivity type and such that the first portion is positioned above the section of the doped region defined by the trench isolation structure. The semiconductor layer can further be formed such that the second portion has a second conductivity type different from the first conductivity type and such that the second portion is positioned above the trench isolation structure and laterally surrounds the first portion. A metal silicide layer can be formed so that it overlies the semiconductor layer, thereby creating the required semiconductor-metal junction for the diode.

In one exemplary embodiment, this method can comprise providing a semiconductor substrate having an N-doped region (e.g., an N-well region). A trench isolation structure can be formed such that it laterally surrounds a section of the N-doped region at a top surface of the substrate. Next, a semiconductor layer can be formed on the top surface of the substrate such that it comprises an N-type portion and a P-type portion. Specifically, the semiconductor layer can be formed such that the N-type portion is positioned above the section of the N-doped region defined by the trench isolation structure and such that the P-type portion is positioned above the trench isolation structure and laterally surrounds the N-type portion. A metal silicide layer can be formed so that it overlies the semiconductor layer, thereby creating the required semiconductor-metal junction for the diode.

Also disclosed are embodiments of a design structure for the above-described diode. This design structure can, for example, be encoded on a non-transitory storage medium readable by a computer and can be used in the design process.

Specifically, it can comprise data and instructions that when executed by the computer generate a machine-executable representation of the diode (e.g., a simulation of the diode).

BRIEF DESCRIPTION OF THE SEVERAL VIEWS OF THE DRAWINGS

The embodiments disclosed herein will be better understood from the following detailed description with reference to the drawings, which are not necessarily drawn to scale and in which.

DETAILED DESCRIPTION

The embodiments of the invention and the various features and advantageous details thereof are explained more fully with reference to the non-limiting embodiments that are illustrated in the accompanying drawings and detailed in the following description.

Figure 10:
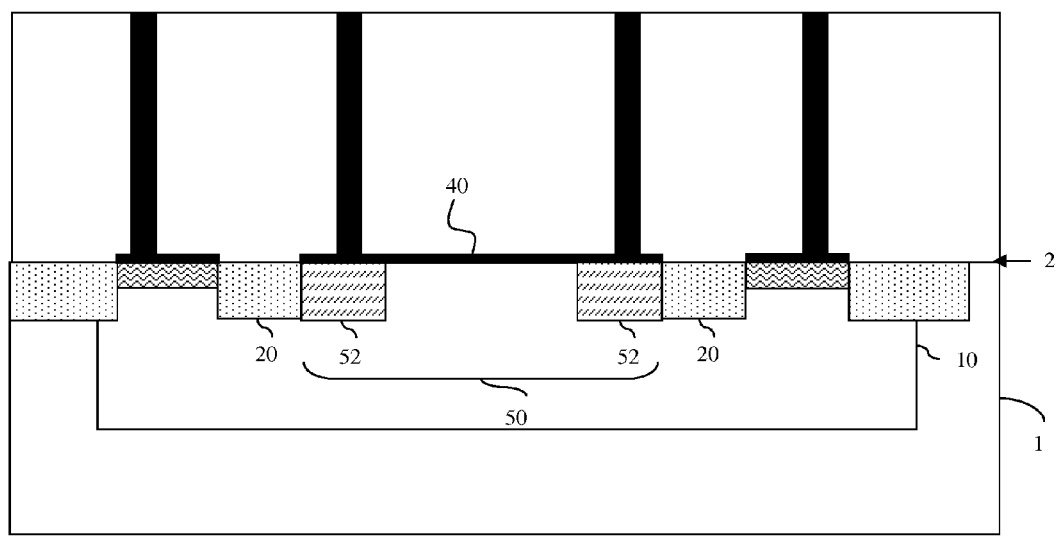
FIG. 10 is vertical cross-section diagram illustrating a Schottky barrier diode.

As discussed above, a Schottky barrier diode is a rectifying element created by a potential barrier, which is formed at the junction between a semiconductor surface and a metal layer on that surface. For example, as illustrated in FIG. 10, a Schottky barrier diode can comprise a doped region 10 (e.g., an N well region or cathode region) in a semiconductor substrate (e.g., a bulk P-silicon substrate). Shallow trench isolation (STI) structures 20 can define an active region 50 of the diode within this doped region 10. A metal silicide layer 40 can be positioned on the surface 2 of the substrate 1 overlying this active region 50, thereby creating a potential barrier. Such a Schottky barrier diode will typically exhibit a relatively low forward voltage drop and a relatively fast switching speed as compared to a conventional P-N junction diode. However, it will also typically exhibit a relatively high electric field around the outer edge of the semiconductor-metal junction unless it also incorporates second conductivity type guardring 52 (e.g., a P+ guardring). Unfortunately, such a guardring 52 also introduces parasitic capacitance into the device (e.g., between the second conductivity type guardring 52 and the first conductivity type doped region 10 below).

In view of the foregoing disclosed herein are embodiments of an improved Schottky barrier diode. This diode can comprise semiconductor substrate having a doped region with a first conductivity type (e.g., an N-type well region or cathode region). A trench isolation structure can laterally surround a defined section of the doped region at the top surface of the substrate. A semiconductor layer can be positioned on the top surface of the substrate. This semiconductor layer can have a Schottky barrier portion over the defined section of the doped region and also a guardring portion over the trench isolation structure and laterally surrounding the Schottky barrier portion. The Schottky barrier portion can have the first conductivity type (e.g., N-type Schottky barrier portion) and the guardring portion can have a second conductivity type that is different from the first conductivity type of the Schottky barrier portion (e.g., P-type guardring portion). A metal silicide layer can overlie the semiconductor layer, thereby creating the required semiconductor-metal junction for the diode. Thus, this Schottky barrier diode incorporates a guardring to reduce the high electric field around the outer edge of the semiconductor-metal silicide junction. Additionally, since this guardring is separated by a trench isolation structure from the doped region in the substrate below, parasitic capacitance is minimized. Also disclosed are embodiments of a method of forming this Schottky barrier diode and of a design structure for the Schottky barrier diode.

Figure 1:
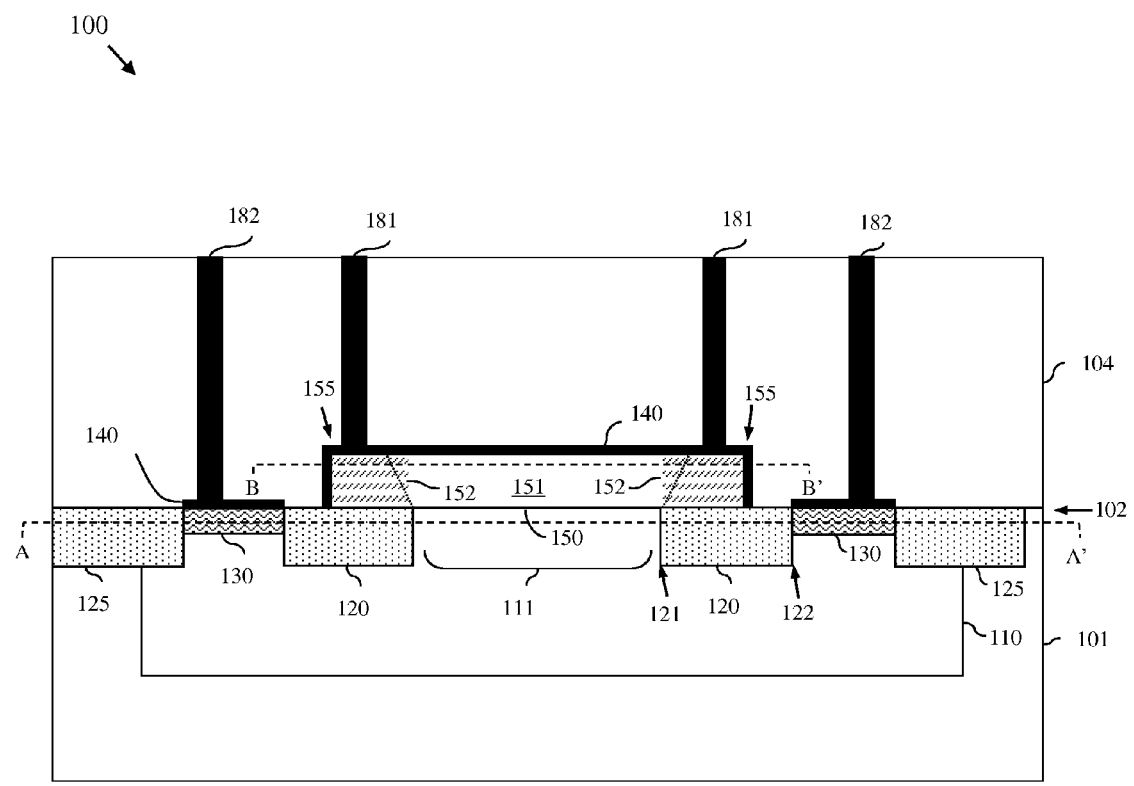
FIG. 1 is a vertical cross-section diagram illustrating an embodiment of a Schottky barrier diode.
Figure 2:
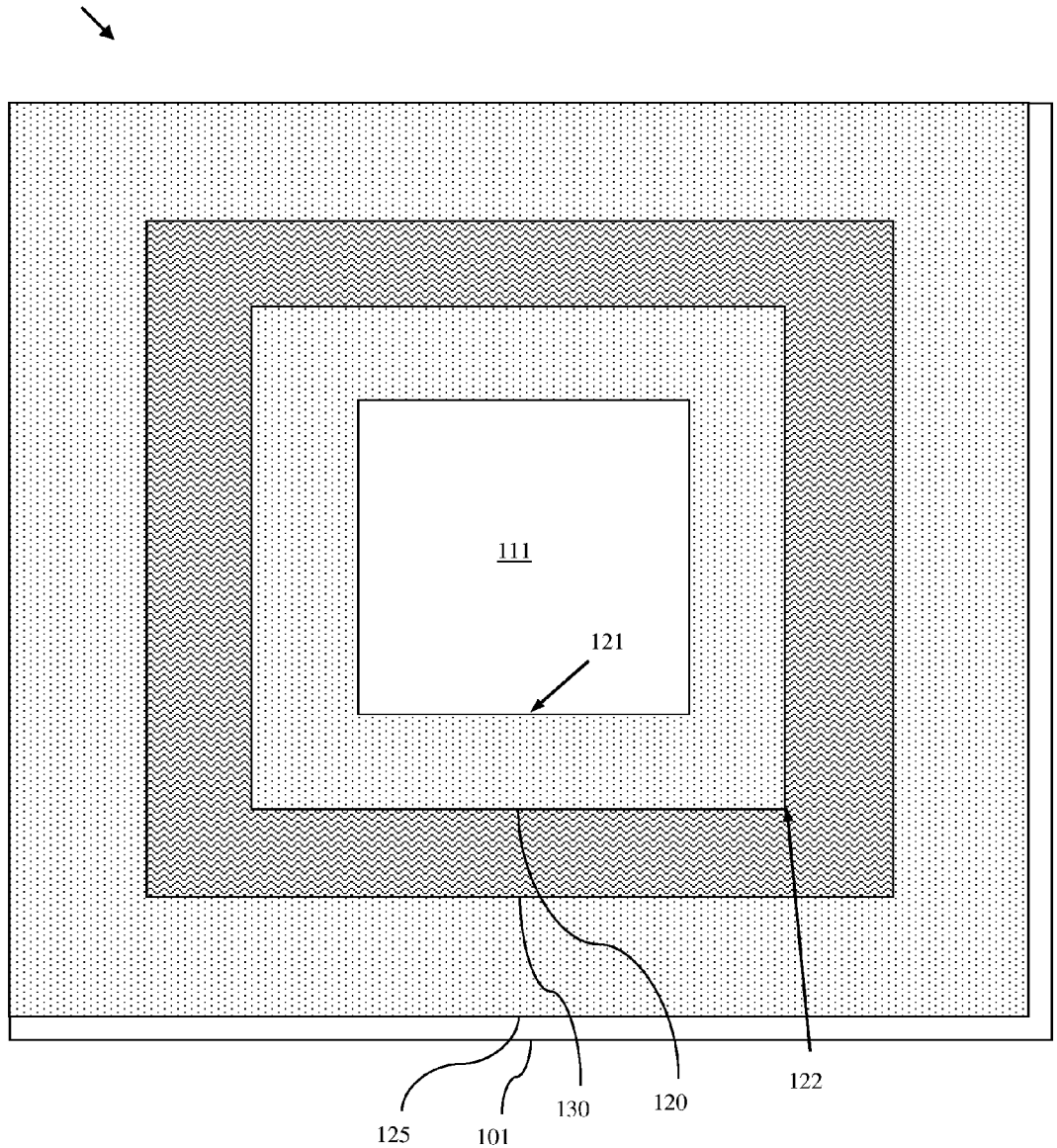
FIG. 2 is a horizontal cross-section diagram illustrating the same Schottky barrier diode as shown in FIG. 1.
Figure 3:
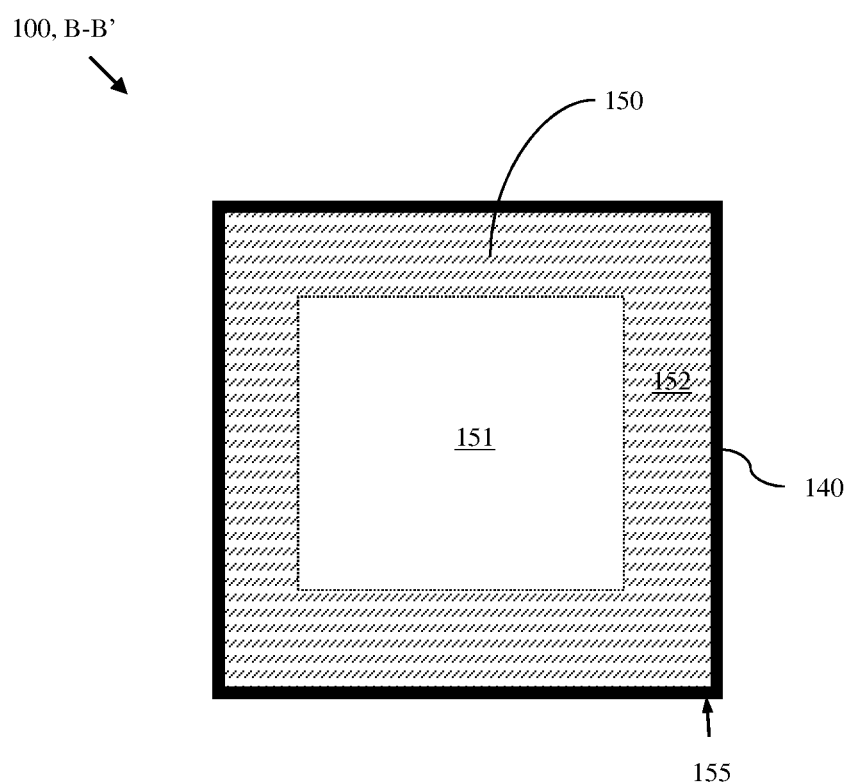
FIG. 3 is another horizontal cross-section diagram illustrating the same Schottky barrier diode as shown in FIG. 1.

More particularly, FIGS. 1-3 illustrate an embodiment of a Schottky barrier (SB) diode according to the present invention. Specifically, FIG. 1 is a cross-section illustration of the SB diode 100 through a vertical plane that cuts across the middle of the device. FIG. 2 is a cross-section illustration of the same SB diode 100 through a horizontal plane A-A', as shown in FIG. 1. FIG. 3 is a cross-section illustration of the same SB diode 100 through a horizontal plane B-B', as shown in FIG. 1.

It should be noted that in this SB diode 100, as described below, the first conductivity type can comprise N-type conductivity and the second conductivity type can comprise P-type conductivity. However, alternatively, the first conductivity type can comprise P-type conductivity and the second conductivity type can comprise N-type conductivity. Those skilled in the art will recognize that a silicon-based semiconductor material having N-type conductivity is typically doped with an N-type dopant (e.g., a Group V dopant, such as arsenic (As), phosphorous (P) or antimony (Sb)). Contrarily, a silicon-based semiconductor material having P-type conductivity is typically doped with a P-type dopant (e.g., a Group III dopant, such as boron (B) or indium (In)).

Referring to FIG. 1, this SB diode 100 can comprise a semiconductor substrate 101 having a doped region 110 with a first conductivity type (e.g., a first conductivity type well region 110). Specifically, as shown in FIG. 1, the semiconductor substrate 101 can comprise a bulk silicon substrate having a second conductivity type that is different from the first conductivity type. The doped region 110 can comprise a well region (i.e., a dopant implant region) within the substrate 101 and having the first conductivity type. For example, the semiconductor substrate 101 can comprise a P-type silicon substrate doped with a relatively low concentration of a P-type dopant (i.e., P− silicon substrate) and the doped region 110 can comprise an N-doped region and, particularly, an N-well within that substrate 101. Alternatively, the semiconductor substrate 101 can comprise a semiconductor-on-insulator (SOI) wafer (not shown) and the doped region 110 can comprise a doped upper layer of this SOI wafer.

The SB diode 100 can further comprise a trench isolation structure 120 positioned laterally around (i.e., defining, laterally surrounding, bordering, etc.) a section 111 of this doped region 110 at the top surface 102 of the substrate 101 (see FIG. 2). For illustration purposes, the shape of this section 111 is shown as being essentially square. However, it should be understood that this section 111 can be defined by the trench isolation structure 120 such that it has any other suitable shape (e.g., rectangle, circle, oval, etc.). This trench isolation structure 120 can have a first side 121 (i.e., an inner side) adjacent to the section 111 and a second side 122 (i.e., an outer side) opposite the first side 121. The trench isolation structure 120 can, for example, comprise a conventional shallow trench isolation (STI) structure. That is, it can comprise a relatively shallow trench extending vertically into the substrate 101 from the top surface 101 and patterned so that it surrounds the desired section 111 of the doped region 110 at the top surface 102. This trench can further be filled with one or more isolation materials (e.g., a silicon oxide, silicon nitride, silicon oxynitride, etc.).

The SB diode 100 can further comprise a semiconductor layer 150 (e.g., a layer of silicon, silicon germanium, silicon carbide, silicon germanium carbide or any other suitable semiconductor material) positioned on the top surface 102 of the substrate 101. This semiconductor layer 150 can comprise a first portion 151 (i.e., a Schottky barrier portion) having the first conductivity type and a second portion 152 (i.e., a guardring portion) having a second conductivity type that is different from the first conductivity type.

Specifically, the first portion 151 of the semiconductor layer 150 can be positioned above the section 111 of the doped region 110 that is defined by the trench isolation structure 120. This first portion 151 can, for example, comprise an N-type portion with approximately the same concentration of an N-type dopant as in the N-doped region 110 below. The second portion 152 of the semiconductor layer 150 can be positioned above the trench isolation structure 120 such that it laterally surrounds the first portion 151 (see FIG. 3). The second portion 152 can, for example, comprise a P-type portion with a relatively high concentration of a P-type dopant. That is, the second portion 152 can comprise a P+ portion with a higher concentration of a P-type dopant than the P− substrate below. The outer edge 155 of this semiconductor layer 150 and, particularly, of the second portion 152 can be above the trench isolation structure 120 such that it is positioned laterally between the first side 121 and the second side 122. In other words, the length of the semiconductor layer 150 can be such that the semiconductor layer 150 does not extend laterally beyond the outer side 122 of the trench isolation structure 120.

It should be noted that this semiconductor layer 150 can, for example, comprise an epitaxially deposited semiconductor layer (i.e., an epitaxial semiconductor layer) and, thus, the first portion 151 can comprise essentially single crystalline semiconductor material and the second portion 152 can comprise essentially polycrystalline semiconductor material. Those skilled in the art will, however, recognize that the location and angle of the interface between single and polycrystalline semiconductor material may vary as a function of the process specifications used during epitaxial deposition. That is, this single crystalline-polycrystalline interface may not be aligned vertically above the interface between the section 111 of the doped region 110 and the inner side 121 of the trench isolation structure 120).

The SB diode 100 can further comprise a metal layer and, particularly, a metal silicide layer 140 overlying the semiconductor layer 150, thereby creating the required semiconductor-metal junction for the SB diode 100. This metal silicide layer 140 can, for example, comprise a silicide of a refractory or noble metal (e.g., nickel, cobalt, tungsten, chromium, platinum, titanium, molybdenum, palladium, etc.) or an alloy thereof.

In addition to the features described above, the SB diode 100 can further comprise one or more layers of dielectric materials 104 (e.g., silicon dioxide ($SiO_2$), silicon nitride (SiN), borophosphosilicate glass (BPSG), etc.) above the semiconductor layer 150 and electrical contacts 181-182 extending vertically through the dielectric layer(s) 104 to the semiconductor layer 150 and to the doped region 110, respectively.

In one exemplary embodiment, one or more electrical contacts 182 to the doped region 110 can land on a second doped region 130 (i.e., well contact region) at the top surface 102 of the substrate 101 adjacent to the second side 122 (i.e., the outer side) of the trench isolation structure 120. This second doped region 130 can be above and can abut the doped region 110, can have the first conductivity type, and can have a higher concentration of the first conductivity type dopant than the doped region 110. For example, the second doped region 130 can comprise a second N-doped region (i.e., an N+ region) with a higher concentration of an N-type dopant than the N-doped region 110 below. Optionally, this second doped region 130 can be annular with respect to the trench isolation structure 120 (i.e., it can laterally surround and be positioned adjacent to the second side 122 of the trench isolation structure 120) (see FIG. 2). In this case, another trench isolation structure 125 (e.g., an additional STI structure) can further laterally surround the second doped region 130 so as to isolate it from other devices on the substrate 101.

It should be noted that the numbers of electrical contacts 181, 182 and the configurations for those electrical contacts can vary by design. For example, rather than contacting the doped region 110 from the top side 102 of the substrate, one or more backside contacts could be used. Those skilled in the art will recognize that, if the Schottky barrier is formed on an N-type portion of the semiconductor layer, the electrical contacts 181 to the Schottky barrier are "anode contacts" and the electrical contacts 182 to the doped region 110 below are "cathode contacts". Contrarily, if the Schottky barrier is formed on a P-type portion of the semiconductor layer, the electrical contacts 181 to the Schottky barrier on the semiconductor layer 150 are "cathode contacts" and the electrical contacts 182 to the doped region 110 below are "anode contacts".

Figure 4:
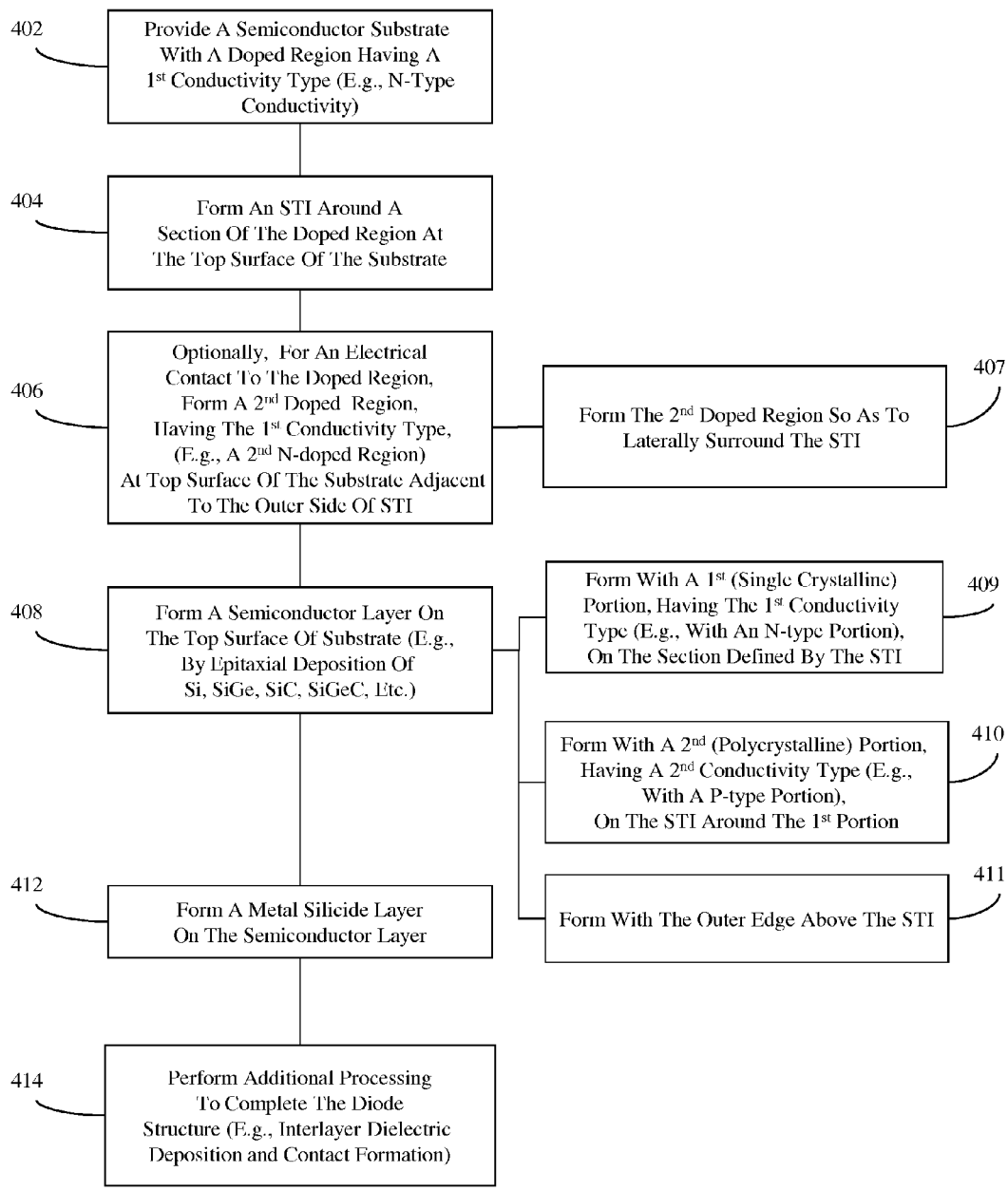
FIG. 4 is a flow diagram illustrating an embodiment of a method of forming the Schottky barrier diode as shown in FIGS. 1-3.
Figure 5:
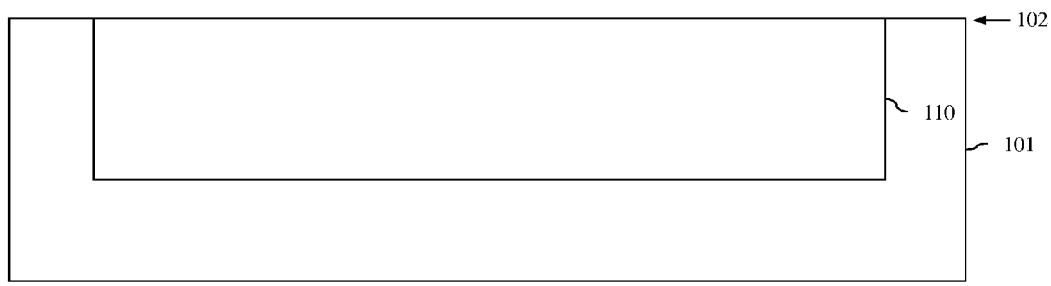
FIG. 5 is vertical cross-section diagram illustrating a partially completed Schottky barrier diode formed according to the method of FIG. 4.

Referring to FIG. 4, also disclosed herein are embodiments of a method of forming a Schottky barrier (SB) diode 100, such as that described in detail above and illustrated in FIGS. 1-3. Specifically, the method embodiments can comprise providing a semiconductor substrate 101 that comprises a doped region 110 (402, see FIG. 5). Specifically, as shown in FIG. 5, the semiconductor substrate 101 can comprise a bulk silicon substrate with a doped region 110 (e.g., a well region, a dopant implant region) within the substrate 101. The doped region 110 can have a first conductivity type and the substrate 101 can comprise a second conductivity type different from the first conductivity type. For example, the semiconductor substrate 101 can comprise a P-type silicon substrate doped with a relatively low concentration of a P-type dopant (i.e., a P-silicon substrate) and the doped region 110 can comprise an N-doped region and, particularly, an N-well within that substrate 101. Alternatively, the semiconductor substrate 101 can comprise a semiconductor-on-insulator (SOI) wafer (not shown) and the doped region 110 can comprise a doped upper layer of this SOI wafer.

Figure 6A:
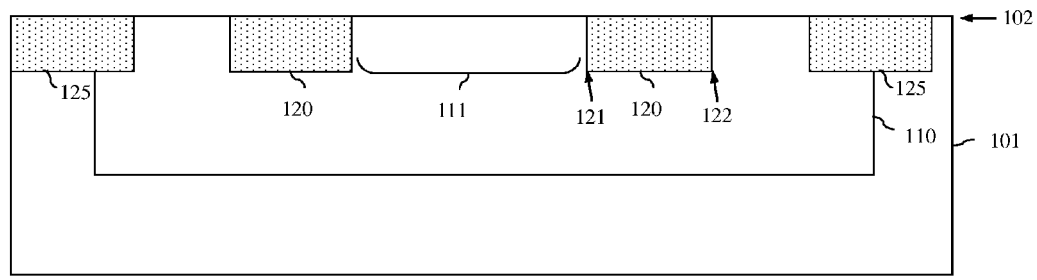
FIG. 6A is a vertical cross-section diagram illustrating a partially completed Schottky barrier diode formed according to the method of FIG. 4.
Figure 6B:
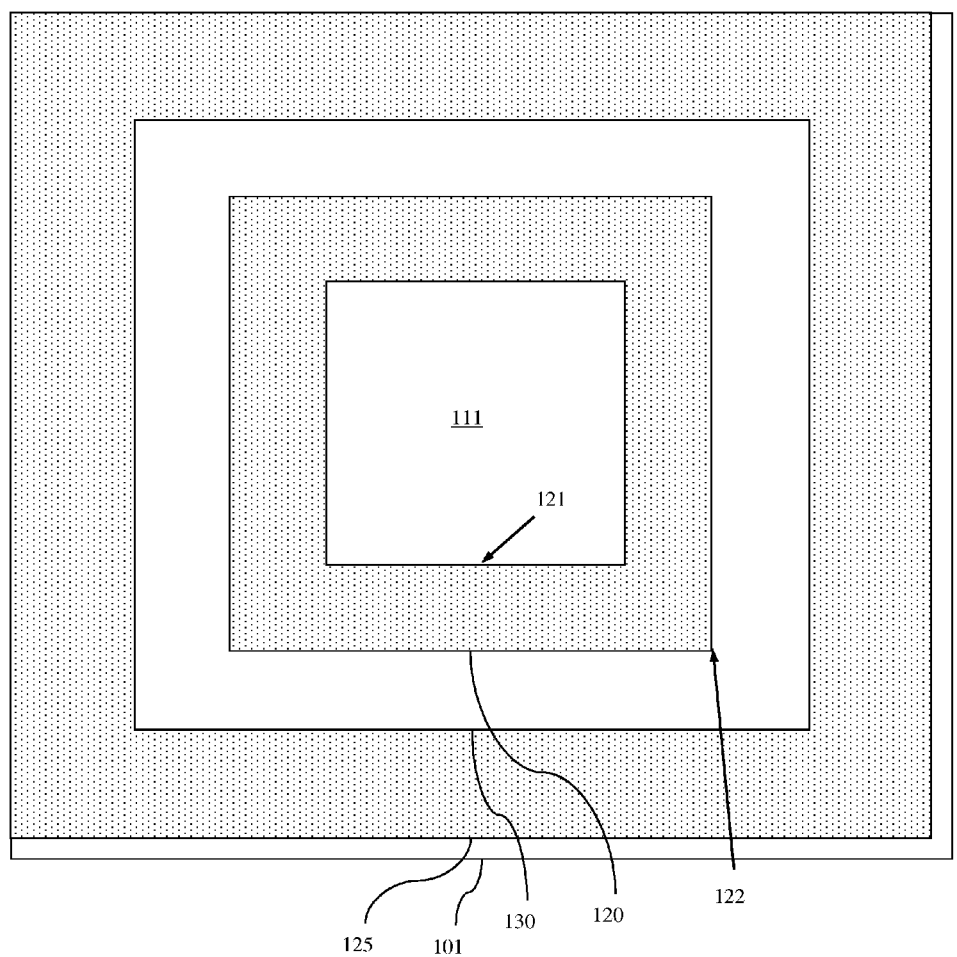
FIG. 6B is a top view diagram of the same partially completed Schottky barrier diode as shown in FIG. 6B.

A trench isolation structure 120 can be formed such that it is positioned laterally around a section 111 of this doped region 110 at the top surface 102 of the substrate 101 (404, FIGS. 6A-6B). That is, the trench isolation structure 120 can be formed such that it defines, laterally surrounds, borders, etc., a designated section 111 of the doped region 110. At process 404, additional trench isolation structures (e.g., trench isolation structure 125) can also be formed, as discussed in greater detail below. The trench isolation structures 120, 125 can be formed using conventional shallow trench isolation (STI) formation techniques. For example, for the trench isolation structure 120, a relatively shallow trench can be formed (e.g., lithographically patterned and etched) such that it extends vertically into the substrate 101 from the top surface 102 and further such that it surrounds the designated section 111 of the doped region 110 at the top surface 102 with a first side 121 (i.e., an inner side) of the trench being adjacent to the section 111 and a second side 122 (i.e., an outer side) of the trench being opposite the first side 121. This trench 120 can further be filled with one or more isolation materials (e.g., a silicon oxide, silicon nitride, silicon oxynitride, etc.). Such STI formation techniques are well-known in the art and, thus, the details are omitted from this specification in order to allow the reader to focus on the salient aspects of the invention. It should be noted that, for illustration purposes, the pattern of the trench isolation structure 120 and, thereby the shape of the section 111 as defined by the trench isolation structure 120 is shown as being essentially square. However, any other suitable pattern for the isolation structure 120 and corresponding shape (e.g., rectangle, circle, oval, etc.) for the section 111 could alternatively be used.

Figure 7:
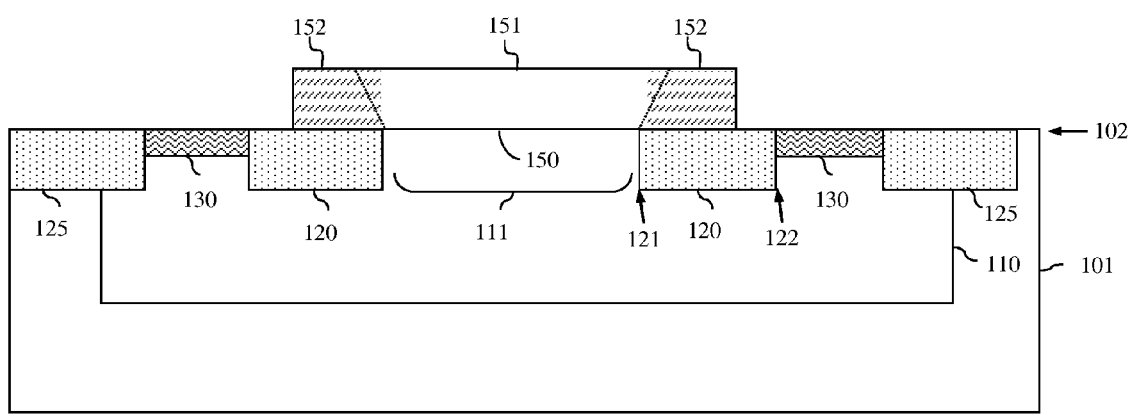
FIG. 7 is vertical cross-section diagram illustrating a partially completed Schottky barrier diode formed according to the method of FIG. 4.

A semiconductor layer 150 (e.g., a layer of silicon, silicon germanium, silicon carbide, silicon germanium carbide or any other suitable semiconductor material) can be formed on the top surface 102 of the substrate 101 (408, see FIG. 7). This semiconductor layer 150 can be formed such that it comprises a first portion 151 (i.e., a Schottky barrier portion), having the first conductivity type, positioned above the section 111 of the doped region 110 (409). The semiconductor layer 150 can further be formed such that it comprises a second portion 152 (i.e., a guardring portion), having a second conductivity type different from the first conductivity type, positioned above the trench isolation structure 120 and, thereby laterally surrounding the first portion 151 (410, see also FIG. 3). Furthermore, the semiconductor layer 150 can be formed such that its outer edge 155 is above the trench isolation structure 120, positioned laterally between the first side 121 (i.e., the inner side) of the structure 120 and the second side 122 (i.e., the outer side) of the structure 120 (411). In other words, the semiconductor layer 150 can be formed so that it does not extend laterally beyond the outer side 122 of the trench isolation structure 120.

This semiconductor layer 150 can, for example, be formed at process 408 using a conventional epitaxial deposition process. Epitaxial deposition techniques are well known in the art and, thus, the details are omitted from this specification in order to allow the reader to focus on the salient aspects of the invention. It should be noted that, as a result of such an epitaxial deposition process, the first portion 151 will essentially comprise single crystalline semiconductor material and the second portion 152 will essentially polycrystalline semiconductor material. However, those skilled in the art will recognize that the location and angle of the interface between single and polycrystalline semiconductor material may vary as a function of the process specifications used during epitaxial deposition. That is, this single crystalline-polycrystalline interface may not be aligned vertically above the interface between the section 111 of the doped region 110 and the inner side 121 of the trench isolation structure 120.

To achieve the desired conductivity types in the first and second portions 151-152, the semiconductor layer 150 can be in situ doped during the epitaxial deposition process with a relatively low concentration of a first conductivity type dopant (e.g., an N-type dopant). Next, the inner portion 151 of the semiconductor layer can be masked and the outer portion 152 can be doped with a relatively high concentration of a second conductivity type dopant (e.g., a P-type dopant). Alternatively, the semiconductor layer 150 can be deposited without in situ doping and multiple masked ion implantation process can be performed to dope the first and second portions 151-152, as desired.

Figure 8:
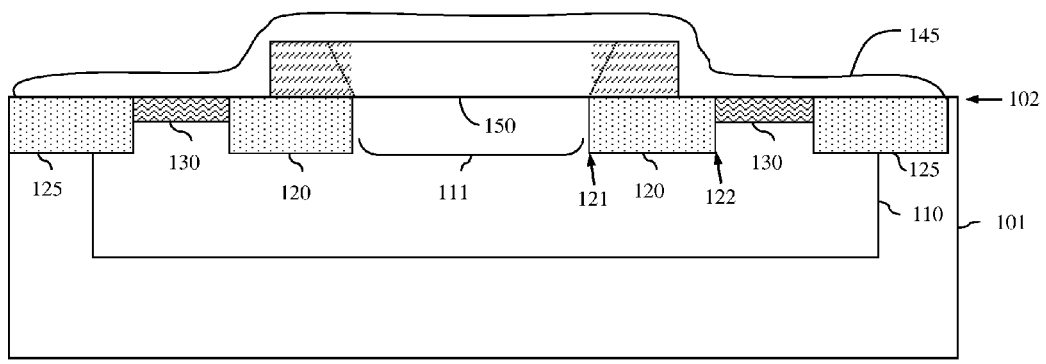
FIG. 8 is vertical cross-section diagram illustrating a partially completed Schottky barrier diode formed according to the method of FIG. 4.
Figure 9:
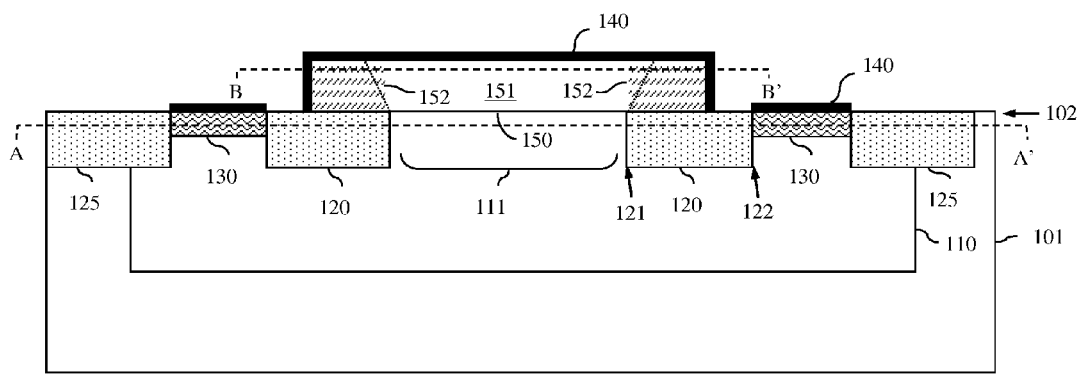
FIG. 9 is vertical cross-section diagram illustrating a partially completed Schottky barrier diode formed according to the method of FIG. 4.

Next, a metal silicide layer 140 can be formed overlying the semiconductor layer 150, thereby creating the required semiconductor-metal junction for the diode 100 (412). Specifically, a metal layer 145 (e.g., a layer of a refractory or noble metal, such as nickel, cobalt, tungsten, chromium, platinum, titanium, molybdenum, palladium, etc., or an alloy thereof) can be deposited (e.g., by sputtering) over the semiconductor layer 150 (see FIG. 8). Then, an anneal process (i.e., a silicidation anneal process, such as a thermal anneal process) can be performed in order to cause metal atoms from the metal layer 145 to react with the silicon material below (i.e., with silicon in the semiconductor layer 150) in order to create the metal silicide layer 140 (see FIG. 9).

In addition to the process steps described above additional process steps can be performed in order to complete the SB diode 100 structure, as shown in FIGS. 1-3 (414). For example, one or more layers of dielectric material 104 (e.g., silicon dioxide ($SiO_2$), silicon nitride (SiN), borophosphosilicate glass (BPSG), etc.) can be deposited and electrical contacts 181-182 can be formed (i.e., patterned and etched) through the dielectric layer(s) 104 to the semiconductor layer 150 and to the doped region 110, respectively. Contact formation techniques are well-known in the art and, thus, the details are omitted from this specification in order to allow the reader to focus on the salient aspects of the invention.

In one exemplary embodiment, one or more electrical contacts 182 to the doped region 110 can be formed at processes 414 so that they land on a second doped region 130 (i.e., well contact region), which is at the top surface 102 of the substrate 101 adjacent to the second side 122 (i.e., the outer side) of the trench isolation structure 120 and which facilitates the electrical connection with the doped region 110. Specifically, prior to forming the semiconductor layer 150 at process 408, a second doped region 130 (i.e., a dopant implant region), having the first conductivity type, can be formed (e.g., using a conventional masked ion implantation process) at the top surface 102 of the substrate 101 adjacent to the second side 122 (i.e., the outer side) of the trench isolation structure 120 (406). This second doped region 130 can be formed so that it is above and abutting the doped region 110 below, so that it has a higher concentration of the first conductivity type dopant than the doped region 110 below and, optionally, so that it is annular with respect to the trench isolation region 120 (i.e., such that it laterally surrounds the trench isolation region 120, see FIG. 7 and also FIG. 2). For example, an N-type dopant can be implanted into the surface 102 of the substrate 101 adjacent to the second side 122 of the trench isolation structure 120 so that the resulting N-doped region 130 laterally surrounds the trench isolation region 120 and has a relatively high concentration of the N-type dopant (i.e., an N+ region) as compared to the N-doped region 110 below. In this case, at process 404, an additional trench isolation structure 125 (e.g., an additional STI structure) can formed that is annular with respect to and separated from the trench isolation structure 120. This additional trench isolation structure 125 can be patterned so as to define the location for the second doped region 130 on the surface 102 of the substrate and so as to electrically isolate the second doped region 130 (see FIG. 2). During process 412, a metal silicide layer 140 can simultaneously be formed on this second doped region 130 and the semiconductor layer 150.

It should be noted that the numbers of electrical contacts 181, 182 and the configurations for those electrical contacts can vary by design. For example, rather than contacting the doped region 110 from the top side 102 of the substrate, one or more backside contacts could be used. Those skilled in the art will recognize that, if the Schottky barrier is formed on an N-type portion of the semiconductor layer, the electrical contacts 181 to the Schottky barrier are "anode contacts" and the electrical contacts 182 to the doped region 110 below are "cathode contacts". Contrarily, if the Schottky barrier is formed on a P-type portion of the semiconductor layer, the electrical contacts 181 to the Schottky barrier on the semiconductor layer 150 are "cathode contacts" and the electrical contacts 182 to the doped region 110 below are "anode contacts".

Also disclosed are embodiments of a design structure for the above-described diode. This design structure can, for example, be encoded on a non-transitory storage medium readable by a computer and can be used in a design process. Specifically, it can comprise data and instructions that when executed by a computer generate a machine-executable representation of the diode (e.g., a simulation of the diode).

Figure 11:
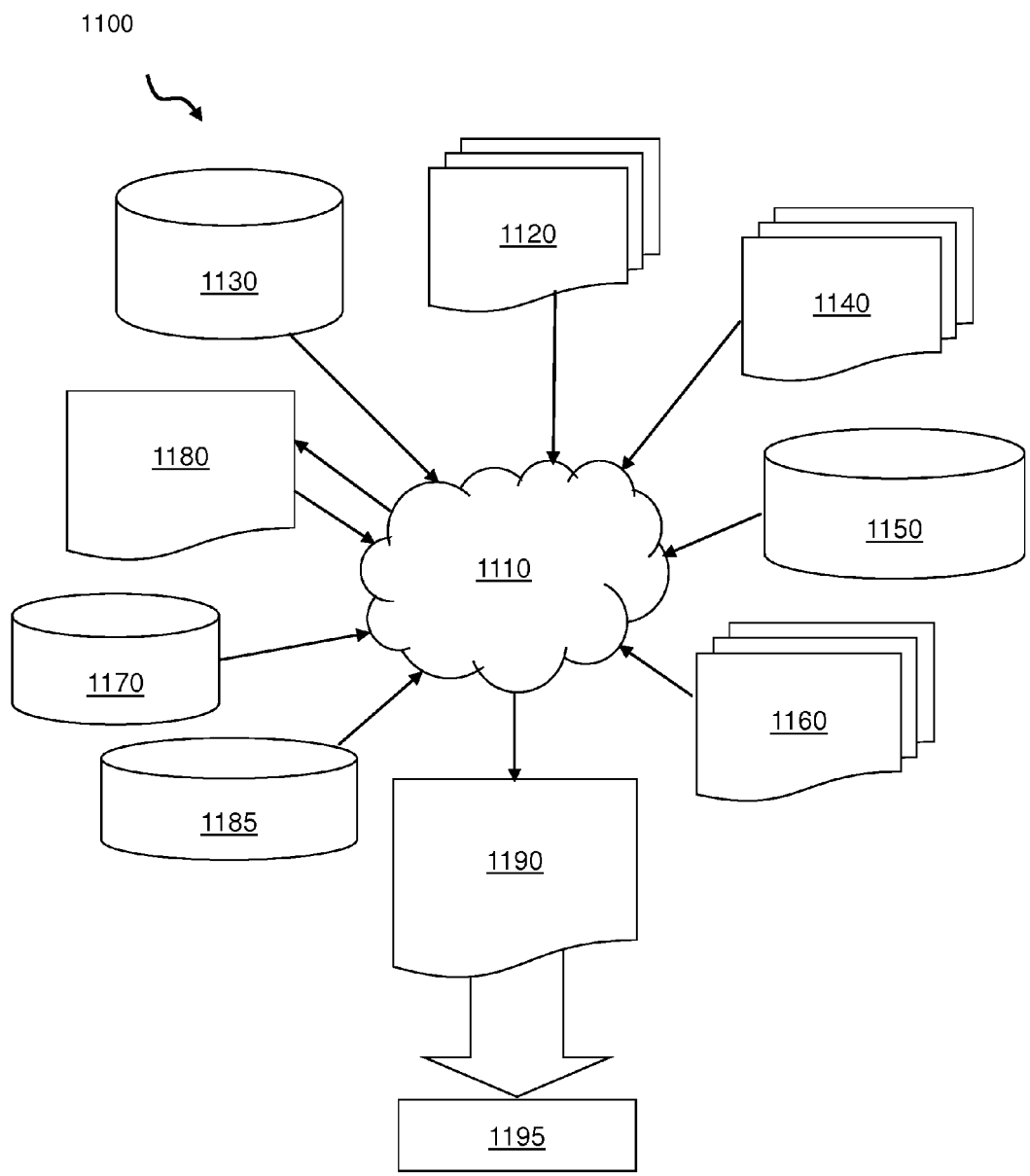
FIG. 11 is a flow diagram of a design process used in semiconductor design, manufacture, and/or test.
Figure 12:
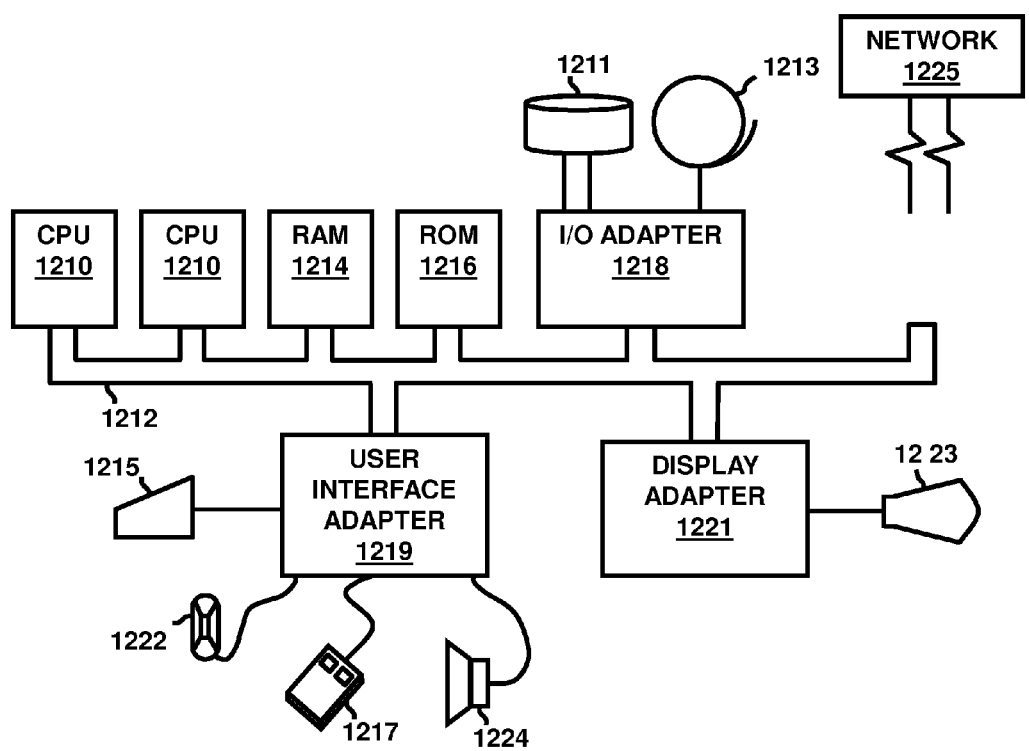
FIG. 12 is a schematic diagram illustrating an exemplary hardware environment that can be used to implement the design flow of FIG. 11.

FIG. 11 shows a block diagram of an exemplary design flow 1100 used for example, in semiconductor IC logic design, simulation, test, layout, and manufacture. Design flow 1100 includes processes, machines, computers and/or mechanisms for processing a design structure to generate logically or otherwise functionally equivalent representations of the diode described above and shown in FIGS. 1-3. The design structures processed and/or generated by design flow 1100 may be encoded on a machine-readable (i.e., computer-readable) transmission or non-transitory machine-readable (i.e., computer-readable) storage device to include data and/or instructions that when executed or otherwise processed on a machine to generate a logically, structurally, mechanically, or otherwise functionally equivalent representation of hardware components, circuits, devices, or systems. Such a machine can include, but is not limited to, any machine used in an IC design process, such as designing, manufacturing, or simulating a circuit, component, device, or system. For example, machines may include: lithography machines, machines and/or equipment for generating masks (e.g. e-beam writers), computers (e.g., as illustrated in FIG. 12 and described below) for simulating design structures or for performing other computer aided design functions, any apparatus used in the manufacturing or test process, or any machines for programming functionally equivalent representations of the design structures into any medium (e.g. a machine for programming a programmable gate array).

Design flow 1100 may vary depending on the type of representation being designed. For example, a design flow 1100 for building an application specific IC (ASIC) may differ from a design flow 1100 for designing a standard component or from a design flow 1100 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 1120 that is preferably processed by a design process 1110. Design structure 1120 may be a logical simulation design structure generated and processed by design process 44-1100 to produce a logically equivalent functional representation of a hardware device. Design structure 1120 also or alternatively comprise data and/or program instructions that when processed by design process 1110, generate a functional representation of the physical structure of a hardware device. Whether representing functional and/or structural design features, design structure 1120 may be generated using electronic computer-aided design (ECAD) such as implemented by a core developer/designer. When encoded on a machine-readable data transmission, gate array, or storage medium, design structure 1120 may be accessed and processed by one or more hardware and/or software modules within design process 1110 to simulate or otherwise functionally represent an electronic component, circuit, electronic or logic module, apparatus, device, or system such as those shown in FIGS. 1-2. As such, design structure 1120 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1110 preferably employs and incorporates hardware and/or software modules for synthesizing, translating, or otherwise processing a design/simulation functional equivalent of the components, circuits, devices, or logic structures shown in FIGS. 1-3 to generate a netlist 1180 which may contain design structures such as design structure 1120. Netlist 1180 may comprise, for example, compiled or otherwise processed data structures representing a list of wires, discrete components, logic gates, control circuits, I/O devices, models, etc. that describes the connections to other elements and circuits in an integrated circuit design. Netlist 1180 may be synthesized using an iterative process in which netlist 1180 is resynthesized one or more times depending on design specifications and parameters for the device. As with other design structure types described herein, netlist 1180 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1110 may include hardware and software modules for processing a variety of input data structure types including netlist 1180. Such data structure types may reside, for example, within library elements 1130 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1140, characterization data 950, verification data 960, design rules 1170, and test data files 1185 which may include input test patterns, output test results, and other testing information. Design process 1110 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1110 without deviating from the scope and spirit of the invention. Design process 1110 may also include modules for performing standard circuit design processes such as timing analysis, verification, design rule checking, place and route operations, etc.

Design process 1110 employs and incorporates logic and physical design tools such as HDL compilers and simulation model build tools to process design structure 1120 together with some or all of the depicted supporting data structures along with any additional mechanical design or data (if applicable), to generate a second design structure 1190. Design structure 1190 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 1120, design structure 1190 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-3. In one embodiment, design structure 1190 may comprise a compiled, executable HDL simulation model that functionally simulates the devices shown in FIGS. 1-3.

Design structure 1190 may also employ a data format used for the exchange of layout data of integrated circuits and/or symbolic data format (e.g. information stored in a GDSII (GDS2), GL1, OASIS, map files, or any other suitable format for storing such design data structures). Design structure 1190 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-3. Design structure 1190 may then proceed to a stage 1195 where, for example, design structure 1190: proceeds to tape-out, is released to manufacturing, is released to a mask house, is sent to another design house, is sent back to the customer, etc.

A representative hardware environment for implementing any one or more of the design flow 1100 processes, described above, is depicted in FIG. 12. This schematic drawing illustrates a hardware configuration of an information handling/computer system in accordance with the embodiments of the invention. The system comprises at least one processor or central processing unit (CPU) 1210. The CPUs 1210 are interconnected via system bus 1212 to various devices such as a random access memory (RAM) 1214, read-only memory (ROM) 1216, and an input/output (I/O) adapter 1218. The I/O adapter 1218 can connect to peripheral devices, such as disk units 1211 and tape drives 1213, or other storage mediums (e.g., a non-transitory storage device storing the design structure(s), as described above) that are readable by the system. The system can read the data and execute the inventive instructions on the design structure, as described above, to implement the design flow 1100. The system further includes a user interface adapter 1219 that connects a keyboard 1215, mouse 1217, speaker 1224, microphone 1222, and/or other user interface devices such as a touch screen device (not shown) to the bus 1212 to gather user input. Additionally, a communication adapter 1220 connects the bus 1212 to a data processing network 1225, and a display adapter 1221 connects the bus 1212 to a display device 1223 which may be embodied as an output device such as a monitor, printer, or transmitter, for example.

It should be understood that the terminology used herein is for the purpose of describing particular embodiments only and is not intended to be limiting of the invention. As used herein, the singular forms "a", "an" and "the" are intended to include the plural forms as well, unless the context clearly indicates otherwise. It should further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. Finally, it should be understood that the description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Therefore, disclosed above are embodiments of an improved Schottky barrier diode. This diode can comprise semiconductor substrate having a doped region with a first conductivity type (e.g., an N-type well region or cathode region). A trench isolation structure can laterally surround a defined section of the doped region at the top surface of the substrate. A semiconductor layer can be positioned on the top surface of the substrate. This semiconductor layer can have a Schottky barrier portion over the defined section of the doped region and also a guardring portion over the trench isolation structure and laterally surrounding the Schottky barrier portion. The Schottky barrier portion can have the first conductivity type (e.g., N-type Schottky barrier portion) and the guarding portion can have a second conductivity type that is different from the first conductivity type of the Schottky barrier portion (e.g., P-type guardring portion). A metal silicide layer can overlie the semiconductor layer, thereby creating the required semiconductor-metal junction for the diode. Thus, this Schottky barrier diode incorporates a guardring to reduce the high electric field around the outer edge of the semiconductor-metal silicide junction. Additionally, since this guardring is separated by a trench isolation structure from the doped region in the substrate below, parasitic capacitance is minimized. Also disclosed above are embodiments of a method of forming this Schottky barrier diode and of a design structure for the Schottky barrier diode.

What is claimed is:

1. A diode comprising:
a semiconductor substrate having a top surface;
a doped region in said substrate, said doped region having a first conductivity type and said substrate having a second conductivity type different from said first conductivity type;
a trench isolation structure extending vertically into said substrate from said top surface, said trench isolation structure further being positioned laterally around a section of said doped region at said top surface of said substrate;
a semiconductor layer on said top surface of said substrate and extending laterally onto said trench isolation structure, said semiconductor layer comprising:
a first portion, having said first conductivity type, above said section of said doped region; and
a second portion, having said second conductivity type different from said first conductivity type, above said trench isolation structure such that said second portion laterally surrounds said first portion; and
a metal silicide layer on said semiconductor layer.

2. The diode of claim 1, said first portion being single crystalline semiconductor material and said second portion being polycrystalline semiconductor material.

3. The diode of claim 1, said semiconductor layer comprising any of silicon, silicon germanium, silicon carbide and silicon germanium carbide.

4. The diode of claim 1, further comprising an electrical contact to said doped region.

5. The diode of claim 1,
said trench isolation structure having a first side adjacent to said section and a second side opposite said first side, and
said semiconductor layer having an outer edge above said trench isolation structure positioned laterally between said first side and said second side.

6. The diode of claim 5, further comprising an electrical contact to said doped region, said electrical contact comprising a second doped region at said top surface of said substrate adjacent to said second side of said trench isolation structure, said second doped region being above and abutting said doped region and having a higher concentration of a first conductivity type dopant than said doped region.

7. The diode of claim 6, said second doped region being annular with respect to said trench isolation structure.

8. A diode comprising:
a P-doped semiconductor substrate having a top surface;
an N-doped region in said substrate;
a trench isolation structure extending vertically into said substrate from said top surface, said trench isolation structure further being positioned laterally around a section of said N-doped region at said top surface of said substrate, said trench isolation structure having a first side adjacent to said section and a second side opposite said first side;
a semiconductor layer on said top surface of said substrate and extending laterally onto said trench isolation structure, said semiconductor layer comprising:
an N-type portion above said section of said N-doped region; and
a P-type portion above said trench isolation structure such that said P-type portion laterally surrounds said N-type portion;
a metal silicide layer on said semiconductor layer; and,
an electrical contact to said N-doped region, said electrical contact comprising a second N-doped region at said top surface of said substrate adjacent to said second side of said trench isolation structure, said second N-doped region being above and abutting said N-doped region and having a higher concentration of an N-type dopant than said N-doped region.

9. The diode of claim 8, said N-type portion being single crystalline semiconductor material and said P-type portion being polycrystalline semiconductor material.

10. The diode of claim 8, said semiconductor layer comprising any of silicon, silicon germanium, silicon carbide and silicon germanium carbide.

11. The diode of claim 8, further comprising an electrical contact to said N-doped region.

12. The diode of claim 8,
said semiconductor layer having an outer edge above said trench isolation structure positioned laterally between said first side and said second side.

13. The diode of claim 8, said second N-doped region being annular with respect to said trench isolation structure.

14. A method of forming a diode, said method comprising:
providing a semiconductor substrate having a top surface;
forming a doped region with a first conductivity type in said substrate, said substrate having a second conductivity type different from said first conductivity type;
forming a trench isolation structure that extends vertically into said substrate from said top surface and that laterally surrounds a section of said doped region at said top surface of said substrate;
forming a semiconductor layer on said top surface of said substrate and extending laterally onto said trench isolation structure such that said semiconductor layer comprises:
a first portion above said section of said doped region and having said first conductivity type; and
a second portion above said trench isolation structure, laterally surrounding said first portion and having said second conductivity type different from said first conductivity type; and
forming a metal silicide layer on said semiconductor layer.

15. The method of claim 14, said forming of said semiconductor layer comprising epitaxially depositing a layer of semiconductor material such that said first portion comprises single crystalline semiconductor material and said second portion comprises polycrystalline semiconductor material.

16. The method of claim 14, said forming of said semiconductor layer comprising depositing a layer of semiconductor material, said semiconductor material comprising any of silicon, silicon germanium, silicon carbide and silicon germanium carbide.

17. The method of claim 14, further comprising forming an electrical contact to said doped region.

18. The method of claim 14, said trench isolation structure being formed so as to have a first side adjacent to said section of said doped region and a second side opposite said first side, and said semiconductor layer being formed so as to having an outer edge on said trench isolation structure positioned laterally between said first side and said second side.

19. The method of claim 18, further comprising forming an electrical contact to said doped region, said forming of said electrical contact comprising forming a second doped region at said top surface of said substrate adjacent to said second side of said trench isolation structure such that said second doped region is above and abuts said doped region and such that said second doped region has a higher concentration of a first conductivity type dopant than said doped region.

20. The method of claim 19, said forming of said second doped region comprising forming an annular dopant implant region around said trench isolation structure.

* * * * *